United States Patent [19]

Matare

[11] 4,012,242
[45] Mar. 15, 1977

[54] LIQUID EPITAXY TECHNIQUE

[75] Inventor: Herbert F. Mataré, Los Angeles, Calif.

[73] Assignee: International Rectifier Corporation, Los Angeles, Calif.

[22] Filed: Nov. 14, 1973

[21] Appl. No.: 415,762

[52] U.S. Cl. .............................. 148/172; 148/171; 148/1.5; 75/65 ZM; 156/602; 252/62.3 GA; 118/400

[51] Int. Cl.² ...................................... H01L 21/208

[58] Field of Search .................. 148/171, 172, 1.5; 75/65 ZM; 156/602; 252/62.3 GA

[56] References Cited

UNITED STATES PATENTS

| | | | |
|---|---|---|---|
| 3,086,857 | 4/1963 | Pfann | 75/65 ZM X |
| 3,268,301 | 8/1966 | Rummel et al. | 156/602 |
| 3,411,946 | 11/1968 | Tramposch | 148/172 X |
| 3,676,228 | 7/1972 | Sakurai et al. | 148/171 |
| 3,713,900 | 1/1973 | Suzuki | 148/1.5 |
| 3,752,713 | 8/1973 | Sakuta et al. | 148/171 |
| 3,783,825 | 1/1974 | Kobayasi et al. | 148/1.5 |
| 3,874,952 | 4/1975 | Woodall | 148/171 |
| 3,879,235 | 4/1975 | Gatos et al. | 148/171 |
| 3,909,317 | 9/1975 | Itoh et al. | 252/62.3 GA X |

*Primary Examiner*—G. Ozaki
*Attorney, Agent, or Firm*—Ostrolenk, Faber, Gerb & Soffen

[57] ABSTRACT

In a preferred embodiment, a technique and associated apparatus for producing heteroepitaxial semi-conductor junctions preferably for Group III-V compounds in an improved liquid-solid transport method, placing a prescribed doped "limited-volume" melt directly upon a host substrate and treating these in a very precisely controlled heating-cooling schedule and associated equipment whereby the substrate is melt-back to a prescribed degree, and then very carefully recrystallized in a crystal layer of the desired volume and stoichiometry (determined by the melt-volume). This is preferably effected by transport through a vertical temperature gradient; with the seed crystal (or melt) used as a saturation source to effect melt-back and such that the doping at the junction is effected by substrate dopant and melt dopant; the effect will be to enhance regrowth of a perfect epitaxial junction already formed, like a junction formed from a gallium, unsaturated aluminum-zinc melt on a gallium arsenide substrate, the substrate crystal serving as a saturation source. Preferably the Peltier cooling of the liquid-seed interface is used for fine control of the cooling and interface temperature, resulting in very low dislocation counts and high radiation efficiency and speed for junctions used as light emitters.

8 Claims, 16 Drawing Figures

FIG. 2-A

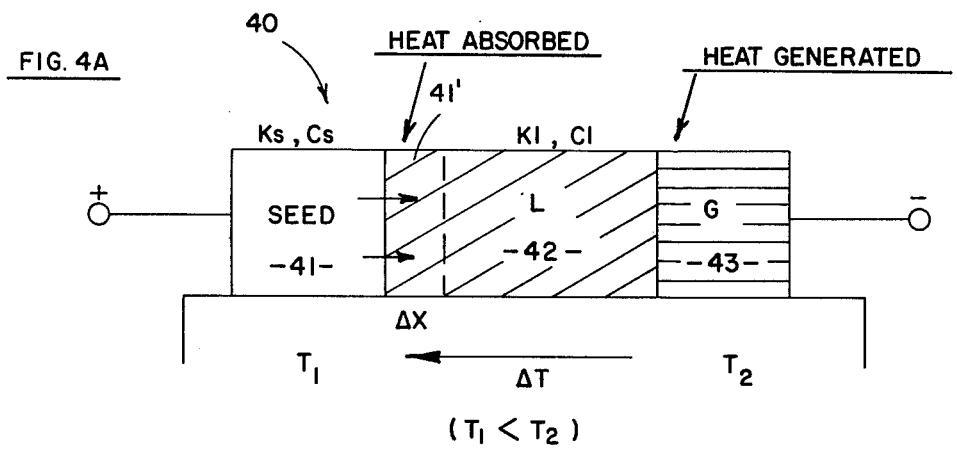
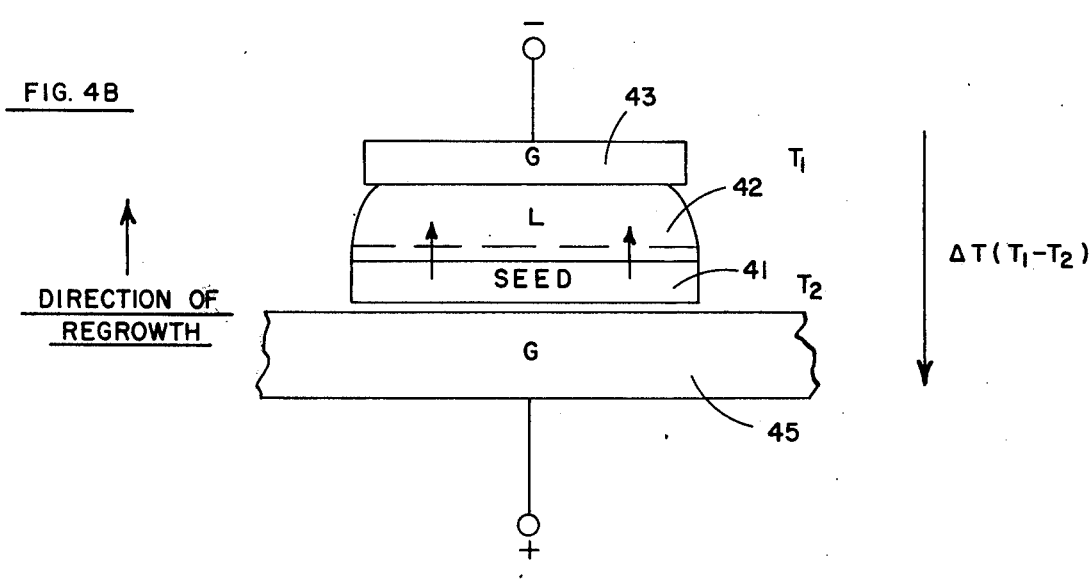
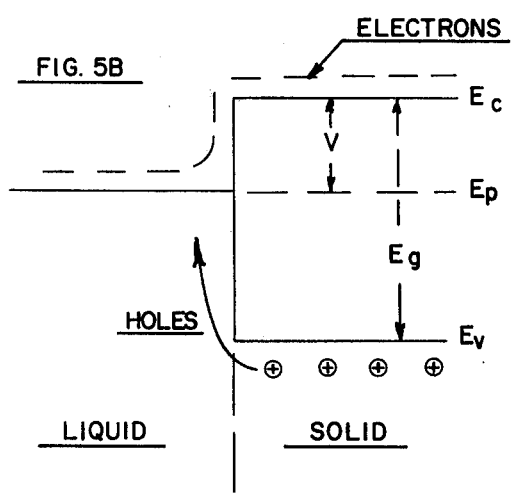
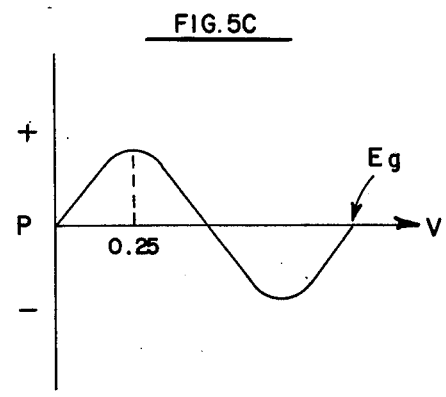

LIQUID EPITAXY TECHNIQUE

BACKGROUND, FEATURES

The production of high quality p-n junctions, i.e., with a minimum of interface dislocations, is a major goal in modern semiconductor technology.

Chemical vapor has commonly been used for junction formation, but suffers from the fact that the substrate surface is not sufficiently cleaned and "built-down" (etched), this being basic to proper regrowth of the desired faultless crystal here. This is especially important where an insulator is used as the deposition substrate.

In "III–V" and "II–VI" compounds, forming a junction from a certain lattice match can be established when compounds with related crystal structure are combined, e.g.

InSb and GaSb.

The difference in lattice constants of these compounds:

InSb: $a'_o = 6.485$ A
GaSb: $a_o = 6.095$ A is 0.390 A.

But if the interface is formed on account of a variable stoichiometry of the mixed crystal:

$In_xGa_{1-x}Sb$ the value of $x$ will define the actual lattice mismatch.

[See: H. F. Mataré, "Heteroepitaxy," Scientia Electrica, Vol. XV, Fasc. 3 (1969), pp. 95–109.]

The number of dislocations formed at the interface is proportional to the lattice mismatch $\delta = (a'_o - a_o)/a_o$, $\delta$ being a function of $x$.

In the search for useful material combinations for heterojunctions, the materials:

GaAs and AlAs appear very attractive. Here the lattice constants are:

GaAs:
$a_o = 5.646$ A
$a'_o = 5.639$ A with a difference $a_o - a'_o = 7 \times 10^{-3}$ A for a $\delta$ value of 0.124%.

While the case InSb/GaSb has a basic mismatch of 6.4% and induces a dislocation density of more than $10^{10} cm^{-2}$, the combination GaAs/AlAs includes a dislocation density of only $10^8 cm^{-2}$. These figures decrease obviously for graded interfaces and, for $Ga_xAl_{1-x}As$, a normal value of $x = 0.7$ will result in less than $10^5$ dislocations $cm^{-2}$ when conditions of growth are optimized.

This optimization is brought about in liquid heteroepitaxy by a graded admixture (i.e., $x$ is graded) in the interface after melt-back — a "graded junction" resulting. The GaAs of the wafer should be replaced gradually by the ternary compound with decreased x (or increased aluminum content — i.e., graded doping) exhibited across the growing crystal, this resulting from gradual lowering of the temperature and an accompanying drop in saturation. However, forming such a structure is not feasible where any abrupt temperature change may result (e.g. as in the arrangement described in U.S. Pat. No. 3,628,998). In fact, the present state of the art is not equipped to render such "graded junctions" except by means which are very complex and expensive, using apparatus that is impractical for economic mass production. The present invention is adapted to meet this problem, and to supply such graded junctions in a novel, simplified manner.

Rendering a highly perfect hetero-interface, with proper (optimized) doping, is critically important in the production of modern semi-conductor light emitters. Numerous methods have been designed to fulfill these requirements because the faultless merger of semi-conductors with different band-gaps is at the root of efficient light emitters (see, e.g. H. Kroemer, Proceedings IEEE, Vol. 51, No. 12, pp. 1782–1783, December 1963).

Heretofore, in the forming of related junctions, a perfect monocrystal of a basic compound (e.g. a GaAs wafer) is employed as a starting substrate and is disposed adjacent an appropriate (e.g. Gallium-rich) melt and heat treated such that a portion of another crystal is dissolved, and transported in rather massive fashion, across an intermediate transition layer. Then, upon cooling, one or several layers of related compound crystals are deposited. FIG. 9 could be useful for considering prior art devices comprising a semi-conductive medium 9-M, such as pure gallium Ga, sandwiched between a dopant crystal 9-S (e. g. of gallium arsenide) on one side and a substrate wafer 9-W (for instance of gallium arsenide) on the opposite side thereof so that with a prescribed temperature differential (dT) applied thereacross, with the high temperature at wafer 9-S, a migration of gallium arsenide material will be induced across the transport medium 9-M to build up a deposition layer 9-D on the upper surface of wafer 9-W — the layer 9-D being deposited on this surface with no melt-back or regrowth as with the invention, of course. Here, as mentioned above, any oxide layer or other contaminant material or surface imperfections on the deposition surface of 9-W will typically interfere with a good, perfect deposition thereon and compromise the characteristics of the resulting junction; for instance, the oxide can produce all too many crystal dislocation sites leading to mismatch of crystals and very poor semi-conductor characteristics, especially for electro-luminescence applications.

It is an object of this invention — rather than simply depositing such crystal layers and rather than using such a transition layer — to use the substrate wafer as a saturation source, justaposed under a prescribed limited volume melt, then to melt-back to form a correctly composed melt and then to form a graded crystal structure of correct stoichiometry.

A tilting (oscillating) oven (e.g. like one designed by Nelson; see RCA Review 24, 603, 1963) has served as a starting point for dissolution-regrowth work. Such oven manipulation is grossly impractical and ineffective for material transport. This method is the basis for improved multilayer growth methods as described by Panish et al. (M. B. Panish, I. Hayashi, and S. Sumski, Applied Physics Letters, Vol. 16, No. 8, pp. 326–327, 15 Apr. 1970). In the "Panish" method, the surface conditions of the starting wafer are somewhat critical but several layers can be deposited in a continuous process, using a sliding graphite crucible with several melts. This method has its shortcomings, however. A wafer so formed (by the Nelson or Panish techniques) can, on the one hand, readily be left unaffected (untreated); or conversely, the wafer can be taken up and destroyed by the melt — only a minor shift in conditions can do this! Such techniques, unlike the invention, do not correctly "melt-back", do not use a limited-volume melt, and don't use the substrate wafer as a second source of dopant.

This invention is designed to improve on the foregoing, using a unique stationary, vertical oven with a prescribed temperature gradient and using a limited-volume melt/substrate wafer package, this package being transported through the oven so as to subject it to a very precisely controlled heat cycling — as a result of which the wafer is melt-back a prescribed distance, corresponding to the melt volume, and recrystallizes to form a junction which is graded in a very precise, desirable manner by a gradual, precisely-controlled cooling — this being optimized in given instances by "Peltier cooling".

In laser structures with optimized confinement, layer sequences like:

GaAs (N) — $Ga_xAl_{1-x}As$(N) — GaAs (N$^-$) — $Ga_x.Al_{1-x}As$(P) are necessary. (See FIG. 1C)

In recombination radiation diodes, a simple double structure of the form:

GaAs (N) — $Ga_xAl_{1-x}As$(P)
GaAs (P) — $Ga_xAl_{1-x}As$(N)

can be used to deliver recombination light with a high efficiency because of minimized interface dislocation density and due to the effect of carrier confinement.

Such devices will generally exhibit a band structure as shown in FIG. 1A. Here, a two-junction device 1 is shown (such as may be used as an electro-luminescent device — e.g. a light emitting diode, LED — and well known in the art). Device 1 comprises a positive layer 5 (e.g. comprising relative pure GaAs (P) with $10^{17}$ to $10^{18} cm^{-3}$ dopant concentration); and opposite thereto a negative layer 9 (for instance, comprising a mixture of gallium, aluminum and arsenic: $Ga_xAl_{1-x}As$, with $x = 0.7$ and tellurium as a dopant); plus an intermediate transition layer 7, comprising a transition mixture falling between the mentioned compositions of 5 and 9, to comprise a "graded junction" as will be understood by those skilled in the art. For instance, here, the concentration of gallium will change very gradually from about $x = 1.0$ at the layer 5/7 interface to about 0.7 at the 7/9 interface; with the aluminum concentration comprising the balance thereof (varying inversely, of course, as known in the art).

Associated curve P-I is a plot of the energy bands (energy levels) in the layers of device 1; the energy bands being generally defined in electron volts.

An electric potential is applied to the opposite faces of device 1 [that is, to a first contact terminal 2' associated with metal plate 3' on the one hand, and to oppositely charged second terminal 2 connected to its contact plate 3, of any suitable shape — e.g. circular — with potential being applied thereto to generate radiation from the junction].

Here, the radiation $h\nu$ will be understood to arise in the interface between layers 5 and 7, proceeding out through layer 9 — the "high gap side" which has a wider forbidden gap and is transparent to radiation $h\nu$. (Layer 7, or transition zone T, is where carrier recombination occurs to generate the radiation $h\nu$.) Here an initial wafer (GaAs) can represent the "small gap crystal," on which a "wide gap crystal" ($Ga_xAl_{1-x}As$) is deposited so as to form transition zone 7 therebetween. Since a bias in the forward direction here will cause a strong carrier injection, the quasi-Fermi level difference ($Z_e - Z_h$) places the respective Fermi levels into the bands, and the barrier forms potential wells at the interface (carrier recombination takes place preferentially within the transition zone, causing a high rate of radiative recombination, as necessary for high external quantum efficiency).

The production of these interfaces poses stringent requirements on wetting, melt-back, and regrowth conditions. In a simple dipping procedure, catastrophic problems can arise, some stemming from uncontrolled surface conditions and "melt attack". Similarly, a "solid-liquid-solid" transport growth mode, using only a single source of temperature gradient (like Peltier current), is not sufficiently controllable as to cooling rate. (See U.S. Pat. No. 3,411,946.)

The present invention represents a marked improvement over conventional techniques forming such "graded junctions" with better, more uniform crystal formation and much better yield.

OBJECTS

The primary object of this invention is to meet and solve at least some of the foregoing difficulties, and to provide at least some of the foregoing features and advantages. A more particular object is to provide this in a simplified technique for producing heteroepitaxy junctions using prescribed novel techniques for melt-back for "controlled recrystallization" and for doping. A related object is to do this with a limited volume doped melt in a vertical temperature gradient using Peltier heating and cooling as an additional control. A related object is to avoid critical control of melt compositions and temperature, while adopting critical control of melt movements and surface conditions.

Another object is to do so with a dopant means which cannot destroy or take-up the entire substrate, even under high temperatures and extreme conditions, as in the prior art (which, for instance, will do so with a variation of over 0.1° C). A related object is to do so providing a prescribed redeposition of silicon dopant (as P$^-$ impurity) admix with zinc close to the recombination zone of a junction or mix with another P-type dopant.

Other features and advantages will occur to those skilled in the art upon consideration of the following description of preferred embodiments of the invention, in conjunction with the accompanying drawings.

In the drawings:

FIG. 1A shows a prescribed multilayer semi-conductor device 1, with an associated energy band distribution herein being plotted (curve P-I) in FIG. 1B, illustrative of the kinds of semi-conductor junctions for which the invention is particularly apt; while FIG. 1C shows an idealized laser (P-P$^-$N) diode and FIG. 1D shows the similarity of this band structure of an N-P$^-$-P$^+$ diode by way of comparison;

FIG. 2 is a very schematic, front elevation view of a controlled heating, transport arrangement provided according to the invention, with FIG. 2A showing an enlarged insert of the subject package to be treated; the heat cycling for this package being summarily indicated in FIG. 3 by a "treatment curve", plotting temperature as a function of time/transport position;

FIGS. 4A and 4B comprise side sectional and frontal elevations, respectively, in a very schematic tutorial manner of a multilayer semi-conductor device as Peltier-heat treated according to the invention;

SUMMARY

Some general characteristics and salient novel features of embodiments according to the invention will now be noted; then the embodiments described. It will be understood that the described technique is adapted for generating a graded, solid-state heterojunction device according to a technique involving melt-back. This melt-back is preferably accompanied by saturation of an unsaturated limited melt element by the substrate crystal, together with a recrystallization per a special cooling schedule, establishing a temperature gradient across the wafer/melt package by heating in a vertical temperature gradient, together with Peltier-cooling.

For instance, silicon is taught to be used as an amphoteric dopant in the lattice of an N-type GaAs wafer, N-type in the substrate and/or a $P^-$ type in the intermediate layer in a $Ga_{1-x}Al_xAs$ junction. Zinc is present in gradually increasing concentration (i.e., as the $x$ increasing gradually from 0.0 to 0.7 across the "grade".) The zinc impurity functions as a primary dopant, facilitating faster recovery time for the junction and increasing its frequency response. The pure Ga functions as a transport medium.

Other combinations of dopants can be used to effect this graded junction optimization for increased radiative recombination and speed.

Figure 9:
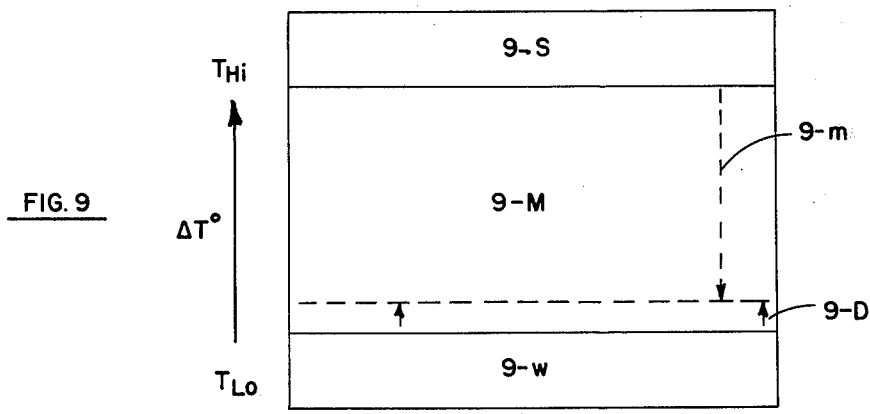
FIG. 9 is a similar showing of a related prior art technique.

An important feature is that this novel device is preferably produced in an oven arrangement with a smooth, vertical temperature gradient and not kinked or discontinuous as in prior arrangements. For instance, in the prior art, ovens with discontinuous gradients have been used in somewhat related circumstances, such as indicated for instance in U.S. Pat. No. 3,628,998. Another novel feature is the melt-back/regrowth technique taught for preparing such devices (as opposed to simple transport and deposition as in FIG. 9) using the wafer substrate as its own second saturation source -- another important feature is the graded, composition junction produced by carefully controlling the drop in temperature to vary $x$ (depending largely upon the amount of aluminum in the gallium melt M and on the temperature profile only to the extent that it changes the amount melted back, this being determined by calibration). Another novel feature is the hydrogen-nitrogen flow-through variation.

PREFERRED EMBODIMENTS

EXAMPLE 1

As a means of describing a specific preferred form of the invention, a specific multilayer junction semi-conductor device 1 (FIG. 1A) will be described as the graded junction project for which prescribed subject materials and heat cycling treatments will later be described (in conjunction with the subject and equipment shown in FIGS. 2 and 2A).

Figure 1A:
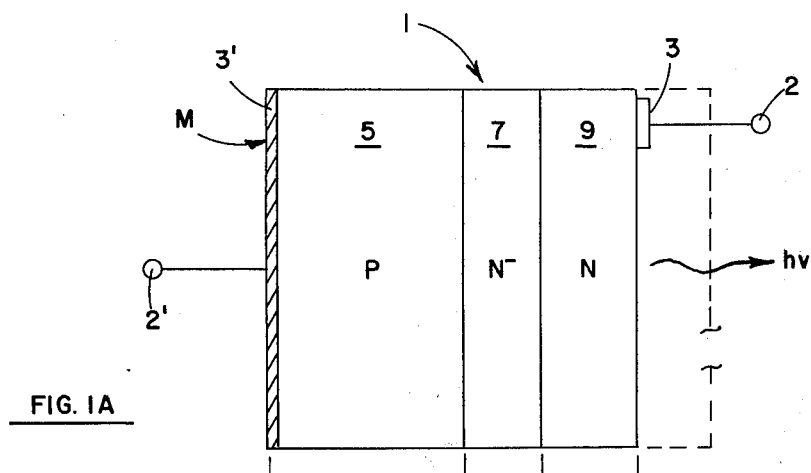
Figure 1B:
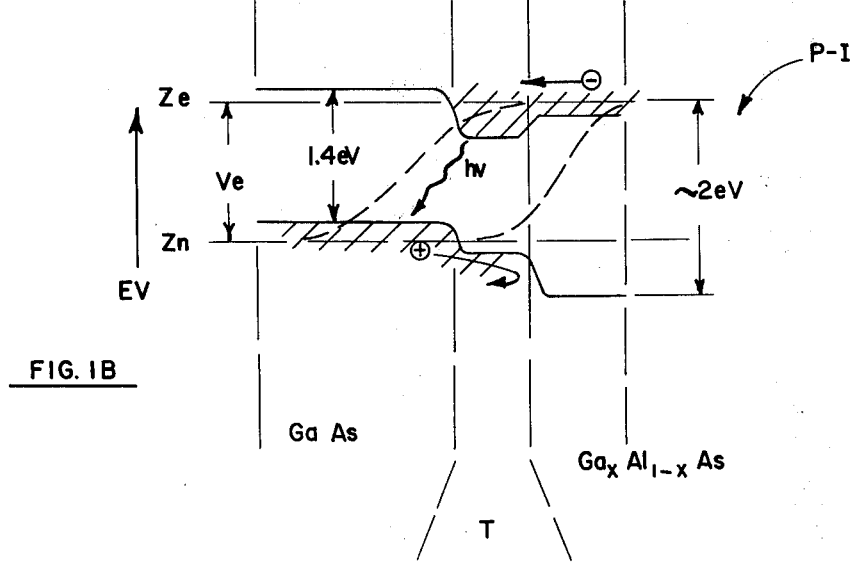
Figure 1C:
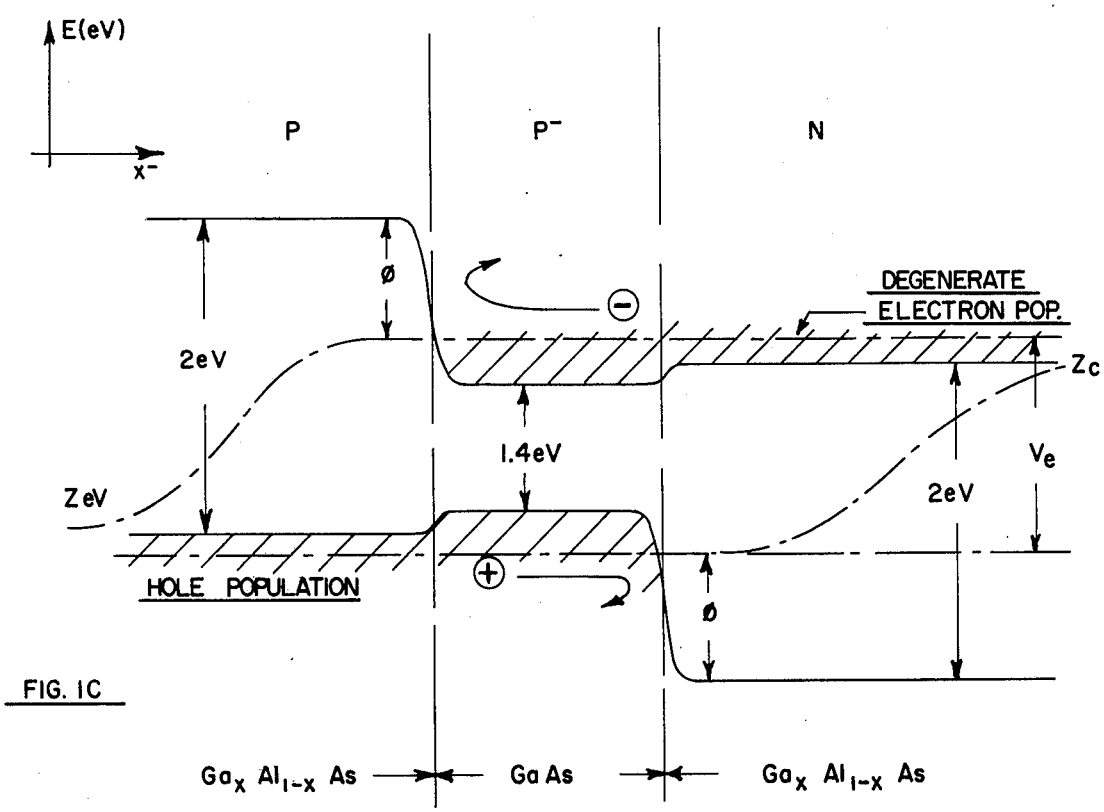
Figure 1D:
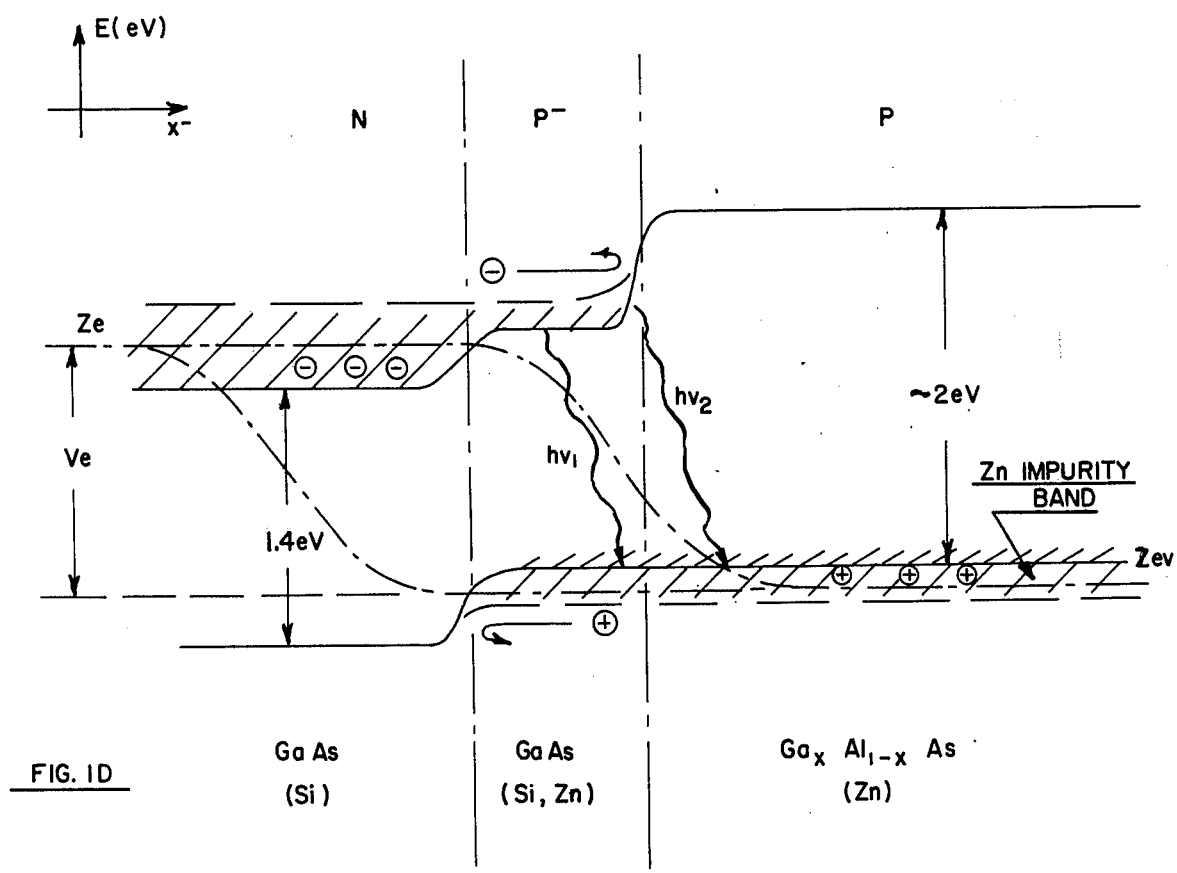

FIG. 1A shows a typical "$P,N^-,N$" layered device 1 (which could alternatively comprise an "$N,P^-,P$" device, as workers in the art will appreciate) as generally described in FIG. 1C and 1D. Here, it will be assumed that the "P layer" 5 comprises the GaAs "base" while intermediate ($N^-$) layer 7 comprises the graded junction; i.e., the variable-saturation, variable-composition layer produced by a gradual drop in temperature as the crystal recrystallizes from the interface. Layer (N) comprises a silicon or tellurium etc. doped layer functioning as the "recrystallization zone" which serves to establish the junction grade.

Figure 8:
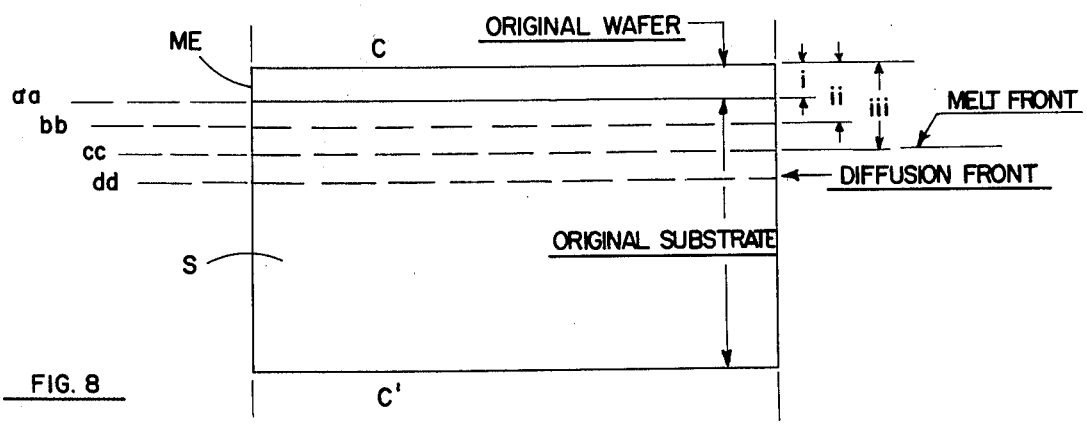
FIG. 8 is a schematic sectional showing of a limited melt and substrate wafer indicating various successive stages of meltback and recrystallization.

In terms of the preparation techniques according to the invention, it will be assumed that layers 5 and 7 constitute the original wafer. Layer 7 will be understood as formed partly by diffusion of Si (FIG. 1) with partial conversion of silicon into an acceptor in this zone. Opposite layer 9 is formed from an abrupt cooling detailed below. The interface melt-back defines the final 5/7 interface, then as cooling begins, recrystallization begins at 7/9 and diffuses from zone 7 until zone 9 is built-up (end of supersaturation). The solubility of silicon e. g. decreases with the aluminum concentration, while the zinc solubility increases herewith. Also, the transition temperature from N-type to P-type for silicon decreases with increasing aluminum concentration. Concerning the temperature profile, one has also to consider that silicon should be concentrated near the solid-liquid interface, which can be realised during the short cooling step a-b in FIG. 3. In such a cooling cycle with a growth rate faster than 0.1 D $\lambda$ (D= diffusion coefficient, $\lambda$=Debye-length) silicon is accumulated near the junction interface and the zinc concentration gradually increases toward the outer layer C (FIG. 8). This is why the temperature drop must be very precisely controlled and kept very gradual and uniform. In layer 7, the gallium concentration could vary from 1.0 to 0.7 while the aluminum correspondingly went from 0.0 to 0.3 (and Zn increases similarly — see FIG. 7).

As the band scheme (energy plot P-1 in FIG. 1B) shows, it is important to grade the $N/N^-$ interface where the large-gap ternary compound has to be fitted to the substrate. This is specifically accomplished by using a limited-volume melt (see melt ME, FIG. 8) and an associated melt-back and graduated recrystallization via a special treatment schedule, as described in conjunction with the apparatus in FIG. 2 below.

Here it should be understood that a limited-volume melt (compare with the typical large-volume melt used heretofore which is relatively large as compared with the substrate) comprises a volume of additive (saturation-source) material which is not substantially more than what will be saturated by dissolution of the substrate during melt-back. Here, typically a few mils melt thickness is contemplated (2 to 10 mils for a 15 mil substrate), this volume being principally determined by the contemplated stoichiometry of the contemplated junction to be formed, allowing for a minor amount of excess melt on the finished product.

Figure 2:
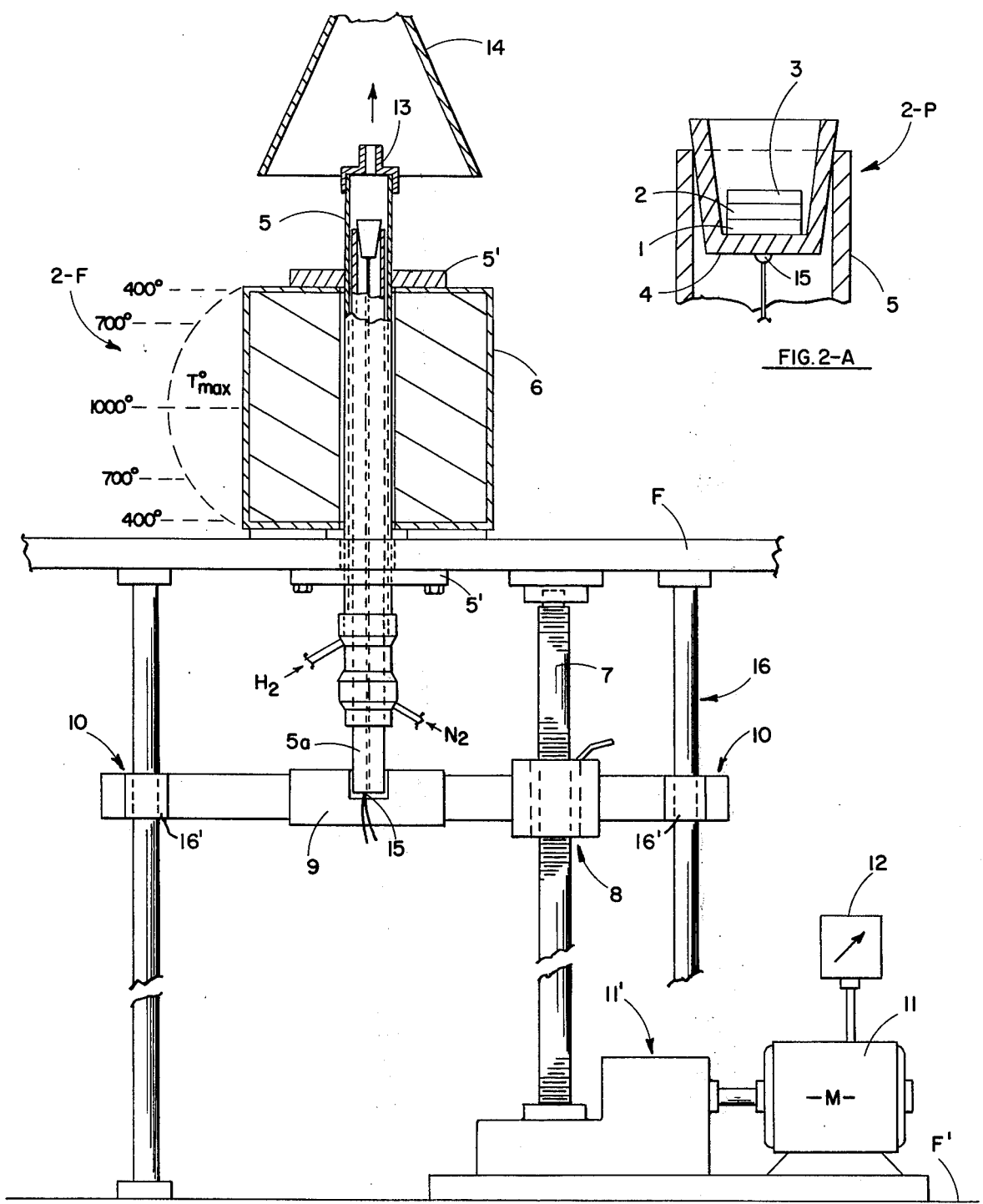

Turning now to FIGS. 2 and 2A, formation of a prescribed graded type semi-conductor junction will be described in terms of the materials required and the processing and associated preferred apparatus used. As insert FIG. 2A shows, the package 2-P forming the subject material for treatment comprises a melt 2, wafer 1, with cover 3 in a receptacle 4. As detailed below, package 2-P is to be heat-cycled by a prescribed transport mode through a graduated heating zone in a fixed oven 6 (with a very carefully controlled temperature profile) in the overall heat treating apparatus 2-F. Of course, the oven (heat-profile) could move and the package stay fixed. Melt 2 comprises a limited volume melt applied on the surface of wafer 1 (the substrate seed crystal) under graphite cover 3. This "sandwich" is retained in the graphite crucible (boat) 4 which is removably mounted atop an inner quartz tube 5a when the latter is lowered through treatment apparatus 2-F, as described further below. Melt 2 is prepared from a very carefully prescribed mixture of the desired elements — here, Ga, Al plus Zn dopant. Its metallic constituents, gallium and aluminum (other melts may include metals like indium, antimony, etc.) comprise the solvent in which is dissolved the necessary amount of GaAs, together with the elements for N-doping (here, silicon or tellurium; initial Si concentration of about and up to $3 \times 10^{18}$ atoms/cm$^3$ in GaAs).

For a compound $Ga_xAl_{1-x}As$ with $x = 0.7$ (minimum concentration), a typical preferred melt 2 is: 50 grams gallium, 1 gram aluminum, 0.6 grams zinc. The aluminum and zinc will be very pure (99.9999%, at least, as known in the art). This melt is prepared by dissolving Al and Zn in the Ga in a liquid state at a few 100° C to form a homogeneous mixture at high temperature (about 800° C) and after cooling at 100° C applied to the substrate wafer (see crystal 1 in FIG. 2) as a 1 inch square, 4–5 mils thick. At this temperature, the package, under graphite cover 3 in crucible 4, is loaded onto tube 5, under an inert atmosphere.

The substrate seed crystal or wafer 1 comprises in this embodiment a relatively pure gallium-arsenide: GaAs, N-type crystal, as known in the art, preferably in a wafer approximately 1 inch square by 15 mils thick. Now, for such a wafer, it will be assumed that the contemplated melt-back and recrystallization zone (directly analogous to zones 7/9 in FIG. 1A) will be on the order of 1 to 2 mils thick. This thickness must be dissolved or melt-back into wafer 1 and then built up again by recrystallization. Accordingly, melt 2 will comprise approximately 10 grams of the recited material applied on the wafer — this being computed on the basis of desired recrystallization stoichiometry due to temperature, phase diagram and cooling cycle (Peltier cooling).

Of course, workers in the art will appreciate that for a different final-recrystallized stoichiometry, the mass and/or constituents of melt 2 and the temperature profile will be modified accordingly. Also, a different substrate wafer may be used (mass and/or constituents) within certain limits. Although the invention is preferably adapted for Group III–V materials, it can be applied to other combinations such as II–VI materials.

Figure 3:
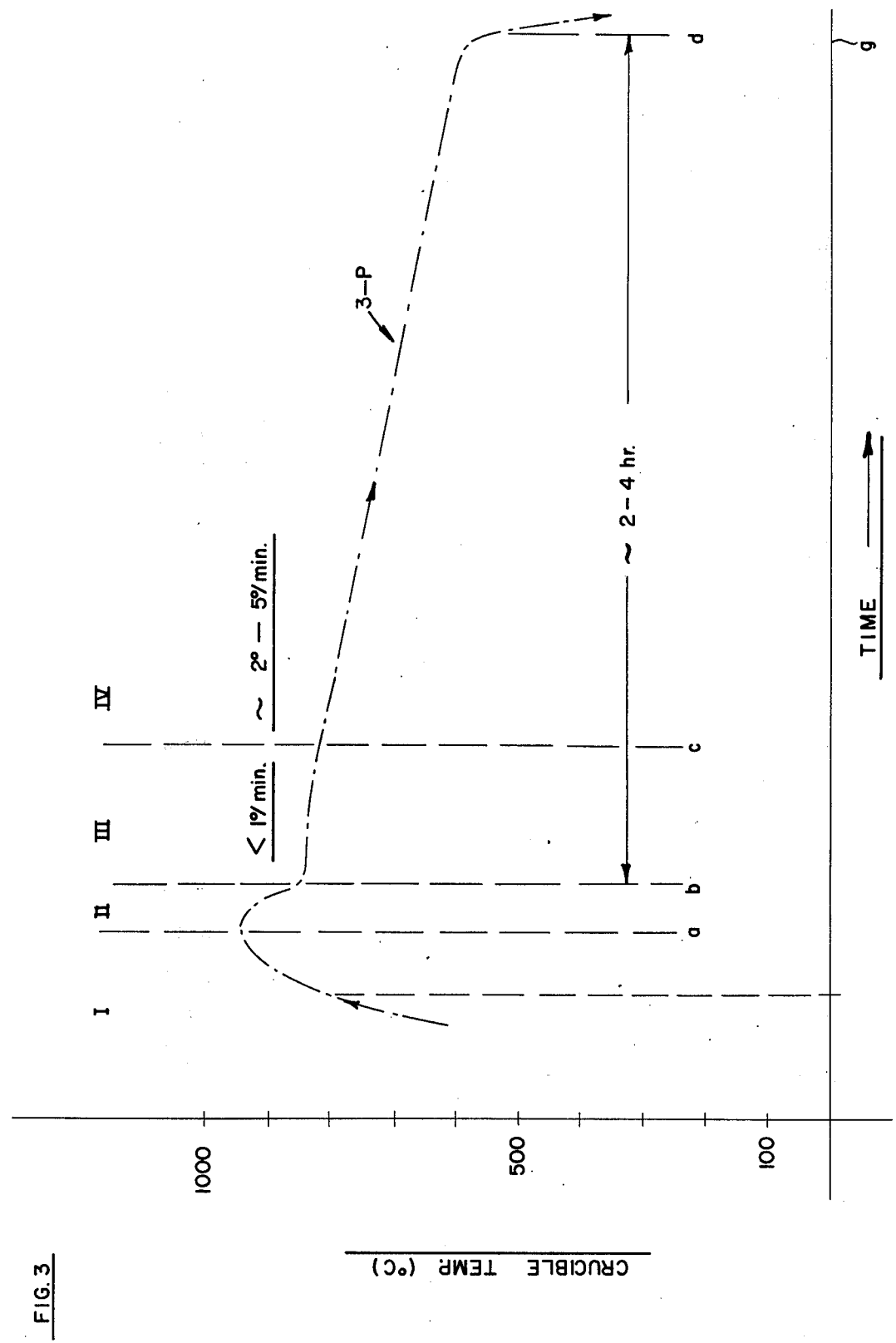

The oven heat profile — transport mode adapted to provide the aforementioned melt-back and recrystallization will now be described with reference to the apparatus in FIG. 2. Heating apparatus 2-F in FIG. 2 comprises an oven-transport arrangement adapted to translate package 2-P through a prescribed vertical temperature gradient provided by an oven 6. This path is defined by cylindrical quartz tube 5 (here, about 2½ inches in diameter; and somewhat longer than oven 6), and inner quartz tube 5-A, concentrically disposed within tube 5 and adapted to carry package 2-P while being translated through tube 5. Tube 5 establishes a transport passageway through oven 6, as well as directing and confining the ambient gases circulated up this passageway and around the package 2-P. A disc 5' of quartz is also provided to cover the lower end of inner quartz tube 5A adjacent the intake for the gas-flow system, this disc allowing passage of thermo-couple leads 15, introduced from appropriate external instrumentation (not shown, but well understood in the art) to be attached to the bottom of crucible 4 at 15 for monitoring its temperature. Surrounding the medial length of tube 5 are the heating elements of oven 6, here, a resistor-wound type oven adapted to provide the indicated temperature profile up to a maximum of about 1000° C, as indicated in FIG. 3. Preferably, this comprises a "Lindberg," tubular oven with the windings arranged so as to provide a maximum central temperature (all temperatures as detected on crucible 4) at the indicated 1000° C approximately at the center of tube 5, with the indicated smooth graduated temperature rise and fall around this maximum — this temperature profile (vertical temperature gradient) being, of course, modifiable to an extent as understood in the art. Other alternative heating means may, of course, be provided to establish this heating cycle as known in the art (e.g. RF coils and intercept shaping).

A very important parameter here is that the horizontal gradient, across the diameter of quartz tube 5 (especially at package 2-P therein), must be held essentially at zero, i.e., no more than approximately ±0.5° C.

The inner quartz tube 5A is projected externally below the outer quartz tube 5 and descends well below oven 6, being bottom-mounted upon a prescribed vertically-reciprocable platform 9. Platform 9 is mounted for rectilinear reciprocation up and down along the axis of tube 5 by low-friction couplings 16' engaging a respective one of a pair of guide rods 16 to thus form a carriage 10 along which platform 9 is adapted to be slidingly, selectively transported, up and down. A clutch arrangement 8 is coupled to drive platform 9 and is selectively, threadably engageable with a lead screw 7 which, upon rotating, will drive clutch 8 and platform 9 selectively up or down, as well known in the art. This reversible controlled rotation of screw 7 is driven conventionally, such as with motor 11 and associated gear linkage 11', with a speed control means 12 being provided for monitoring package travel — these elements being so well known and conventional as to require no further description or details. A framework F, F', attached to the housing or like stable, fixed structure, is coupled to fixedly position quartz tube 5 at associated adjustable upper and lower mounts 5'.

As mentioned, a gas-flow system is contemplated for flowing hydrogen and nitrogen, selectively, at a prescribed rate up through the gap between inner and outer quartz tubes, these gases being introduced and controlled by conventional means. Hydrogen is introduced at ports H$_2$ and the nitrogen at ports N$_2$, the gases being conducted away through outlet port 13 and associated exhaust conduit 14.

Oven 6 is assumed brought up to the temperature profile indicated in FIG. 3 (in a relatively smooth curve proceeding from room temperature up to the maximum of 950° C and then back again smoothly.) Package 2-P, situated atop quartz tube 5A with its instrumentation and mechanisms all provided in working order, may now be translated through the heating zones. This heat-cycling transport is, according to an important feature, conducted in a prescribed manner, vertically down along the length of tube 5 to invoke the heat cycling temperature-time schedule represented in FIG. 3 and so provide the mentioned temperature gradient and melt-back regrowth mode. For a normal oven-length of 20 inches and a center temperature of 950° C and a border temperature of about 500° C, the gradient across a package of 40 mil thickness sees a gradient of about 1° C:

$$\frac{450° C}{20''} = 22.5° \text{ C/inch} \simeq 1° \text{ C/44.5 mils}$$

Thus, referring particularly to FIG. 3, package 2-P is first lowered relatively quickly (to provide a temperature rise of about 15 to 20° C per minute) down into the approximate center of oven 6, where maximum temperature of 950° C is found, this constituting the "initial phase" I of the cycle, the package 2-P proceeding along the plot 3-P of this cycle in FIG. 3 to point a.

These processes will, of course, be carried out under a hydrogen flow of about 5 liters per minute (for the 2½ inches diameter tube 5 as mentioned) to avoid oxidation of the melt 2 (all temperatures in FIG. 3 taken by thermocouple 15). Passing through a maximum temperature of 950° C at point a, a second "fast cool" phase II is entered. At some point in phase II, the hydrogen flow is terminated to be immediately replaced by a nitrogen flow at the same rate.

Now in the passage along the fast cool phase profile 3-P (from point a to point b and thereafter), certain changes will take place, by design, in the subject substrate and melt. These changes are described below, relative to plot 3-P, and for illustration purposes, shown (very much idealized) in FIG. 8 as substrate S and melt ME.

As workers in the art will realize, various parts and/or methods described above may be modified within the scope of this invention. For instance, another equivalent heat source may be used; it may be translated past the package (or change heat output with time) to otherwise effect the described heat cycling and/or other translation means.

Thermal Cycling

Further description of the melt-back-regrowth process will make reference to FIG. 8 to indicate in a very schematic manner the dissolution of melt ME into the surface of wafer S, according to the desired mode. This, of course, will occur in a very precise, prescribed fashion as a function of the heat-cycling, comparable to temperature profile 3-P as controlled carefully by the transport mechanism.

Generally speaking, this profile P comprises three phases:

Phase I: Heat up with melt-back; here, the melt is rather quickly brought to the center of the oven (preferably heating up at about 15° to 20° C per minute) whereupon the melt takes up material from the seed, or substrate crystal, 1 (S in FIG. 8).

Phase II: Fast cool; an initial rapid, but limited, cooling cycle, during which melt-back is arrested and the thermal momentum terminated with the system being supersaturated and started into a "controlled-cooling" phase to initiate recrystallization and regrowth. (Phase I, together with Phase II, will substantially determine melt-back distance, while Phase I must be made fast enough so that the silicon is deposited preferentially at the solid liquid interface.)

Phase III: Slow cool (regrowth starts); here, a relatively slow, minimum-rate cooling is invoked (here, less than 1° C per minute on the order of 0.1 to 1.0; and preferably 0.5° C per minute). With melting arrested, recrystallization really begins here, at about 100° C below the melt-back temperature. This initiates the very slow initial crystal growth necessary to build further growth, and designed both to minimize the number of dislocations and to convert silicon impurity from N-type to P-type. As mentioned, this is very critical time and the slow gradual decrease in temperature must be maintained to properly initiate the first layer of recrystallization, as well as allowing the melt to further equilibrate thermally. Normal diffusion of the material should provide a homogeneous concentration in zone 7.

Phase IV: Long cool (bulk regrowth); a somewhat faster (than Phase III), terminal, cooling phase which, following the initiation of crystal regrowth, may be carried out somewhat faster, yet still carefully, at a controlled rate to build upon the initial growth, up to a prescribed degree, terminating with the recrystallization of the entire melt-wafer combination to the extent practical (the rate being 2° to 5° C per minute preferably; here a rate of 3° C being used — the entire cooling period lasting approximately 2 to 4 hours for this embodiment). Thus, recrystallizing build-up is achieved, up through the entire cross section of the melt-back area, essentially to the surface, with the cooling being prescribed to also provide a proper stress-annealing.

This melt-back-regrowth mode, according to the invention, will be further, and more functionally, described below, in conjunction with FIG. 8. But, in general, workers in the art will appreciate that while it is extremely important that it be carried out in a very gradual, predetermined manner, with small temperature increments — these establishing the gradient in metal concentration across the junction interface to thus provide the mentioned "graded interface" and dopant distribution — the time-temperature schedule of the type indicated by plot 3-P in FIG. 3 being provided to give the appropriate gradation. Accordingly, workers will appreciate that the gradations of dopant concentration across the recrystallized layer may be adjusted, within limits, and controlled simply according to the cooling rate (in addition to other conventional parameters, such as the melt concentration and substrate doping).

Thus, reviewing profile 3-P in conjunction with the idealized showing of melt dissolution in FIG. 8, the following sequence of events would be typical. Up to point a on profile 3-P, the package 2-P (FIG. 2) is beginning to come up to temperature and, after the prescribed amount of heating, achieves a maximum temperature, represented by point a. Here, the substrate wafer (or seed crystal) 1 (S in FIG. 8) has begun to dissolve partially, to the point of saturation (at the indicated temperature) of the limited melt a (ME in FIG. 8), covering the surface of wafer S. This dissolving-in (melting-back) will proceed to a prescribed degree, depending upon the time-temperature involved — this degree being represented by melt-back from the top wafer surface (plane aa FIG. 8) down a prescribed distance therebelow, namely, to initial melt-back point bb — the associated "sinking in" of melt ME being represented by the bracket ii. As workers in the art can well appreciate, the rise in temperature of the melt/wafer combination will allow an increase in the saturation concentration of gallium-arsenide in melt ME; thus, melt-back will continue moving down below the surface of wafer S to a prescribed terminal point represented by plane cc, corresponding to the final idealized sinking-in iii of melt ME, here, completely and fully dissolved within wafer S (that is, as fully dissolved as it is going to become — there typically being a portion of undissolved liquid gallium, together with a residue of aluminum and zinc, on the surface of wafer S, above the melt-back zone iii) — this being helpful to maintain a protective cover against intrusion of oxygen and related contaminants and thus keeping the recrystallization mode in a "subsurface" mode. Of course, the degree and depth of melt-back will be determined by such parameters as the time and temperature of heating and the amount of material present in the melt. It is a very important, yet novel, feature of this melt-back/recrystallization mode that the final crystal build-up occurs in a "subsurface mode" — something far different from the simple surface deposition and crystallization conventional in the prior art since it involves not only a different mode of crystal growth, but one which is for many purposes much more advantageous and preferable. For instance, by so conducting regrowth below the typical oxide surface layer (e.g. on top layer aa of wafer S), this avoids the influence of surface chemistry which tends to badly interfere with the crystal growth and results in too many surface dislocations. Also, this particular cycle is chosen to concentrate the silicon dopant at the interface, since the solubility of silicon decreases with increasing aluminum concentration; and zinc diffusion into, and Si diffusion out of, the original wafer generate the additional $N^-$ (or $P^-$) layer (see FIG. 1A).

Figure 7:
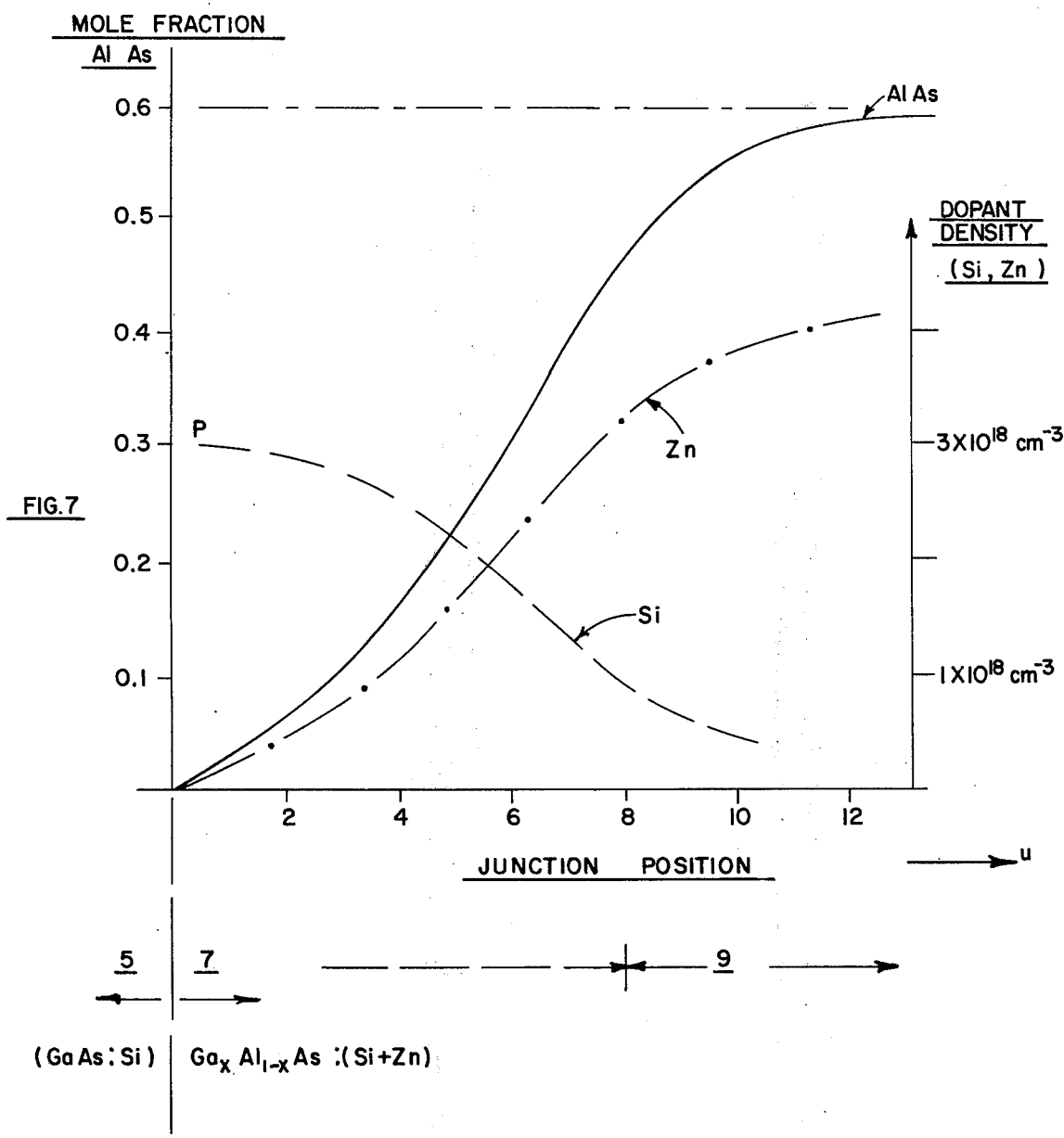
FIG. 7 is a plot of selected material concentrations across the length of a graded junction produced according to the invention.

The final melt-back in the subject case is on the order of 2 or 3 mils, the melt weight being about 10 grams for a wafer 1 inch square by about 15 mils thick — this melt mass, dissolved, being just enough to recrystallize down through the 2 to 3 mil thickness contemplated. This recrystallized layer is of a type most useful for high-speed, high-efficiency LEDS. It has a high silicon concentration at the interface near the junction and a gradually increasing zinc concentration toward the top layer. This dispersion of material concentrations to form such a graded junction may be best appreciated by reference to FIGS. 1A and 7. FIG. 7 represents the distribution of material concentration across graded junction layers 7, 9 starting at their interface therewith substrate wafer 5 the concentration being represented in terms of mole fraction present plotted against distance across the junction, with dopant density also being shown. This figure depicts desired idealized interface conditions for the GaAs(:Si)-GaAs(:Si:Zn)— $Ga_x$-$Al_{1-x}As$(:Zn) junction. It should be appreciated that it is desirable to have both the silicon and the zinc dopants in the subject junction for optimizing radiation efficiency and speed of response — a maximum of zinc concentration being desired for fast response, together with a substantial portion of silicon for high efficiency of radiation.

Workers will perceive that a special feature involves the graded conversion of Si, from the 0.03 eV "shallow acceptor" level to the 0.22 eV SiAs "vacancy complex" level $[V_{As}Si_x]$ — as the aluminum concentration increases and the growth rate is kept slow, but greater than 0.1 $D\lambda$ where D = diffusion coefficient; $\lambda$ = "Debye length."

Incidentally, it should be appreciated that the silicon is functioning as an N material in wafer 5 and as a P material in layers 7 and 9, along with the zinc. Workers in the art will further appreciate the criticality of maintaining a constant temperature across the surface of the melt/wafer (cross section of quartz tube 5), since without a relatively flat, horizontal temperature gradient (0.5° C) the melt front proceeding down through the wafer (e.g. in FIG. 8) will not maintain the uniformly flat profile necessary for forming a proper junction and will result in "cavities".

Workers in the art will recognize that the foregoing Example provides in terms of materials and method a technique for forming heteroepitaxial semi-conductor junctions in a preferred manner (e.g. with a minimum number of dislocations) in a particular crystal growth mode (e.g. decreasing silicon concentration and correspondingly increasing the zinc concentration, etc.). However, it should be appreciated that other related (e.g. Group III/V) materials may be used to produce the same kind of results in the same kind of manner.

Such is indicated below in Example 2, where an indium arsenide InAs (N-type material) is provided as a substrate wafer in operative conjunction with a limited-volume melt comprising a mixture of indium In plus gallium and zinc.

EXAMPLE 2

The schedule of materials, preparation and heat treatment prescribed in Example 1 is followed here, except as otherwise mentioned to produce an Indium-Gallium Arsenide ($In_xGa_{1-x}$) As device, i.e., InAs (P)/InAs($N^-$)/$In_xGa_{1-x}$As(N) with dopants: Si/Si, Zn/Zn, respectively (compare FIG. 1A). Here, the dopant dispersion across the graded junction is essentially as described before (cf. FIG. 7) with the transition layer varying from $In_{1.0}Ga_{0.0}As_1$ to $In_{0.3}Ga_{0.7}As_1$ and with similar melt-back (4-5 mils on 15 mil wafer) and regrowth under similar time-temperature conditions (as with profile 3-P in FIG. 3). A melt of In,Al Ga with Zn,Si dopants on a wafer of InAs will be understood.

EXAMPLE 3

The materials section, preparation and heat cycling prescribed in Example 1 as followed to produce an ($Ga_xIn_{1-x}$)P device, except as otherwise stated or inferred. Here, placing a Ga,In melt (with Zn,Si dopants) on an InP wafer and similarly heat cycling will derive the same kind of InP(N)InP($N^-$)/$Ga_xIn_{1-x}$P(P) junction — again, a "graded junction".

EXAMPLE 4

The materials selection, preparation and heat cycling prescribed in Example 1 is followed to produce an In($As_xP_{1-x}$) device, except as otherwise stated or inferred. Here, placing an In melt (with Zn,Si dopants) on an (InAs) wafer and similarly heat cycling will derive the same kind of InAs(N)/InAs($N^-$)/$As_xP_{1-x}$In(P) junction (graded).

EXAMPLE 5

The materials selection, preparation and heat cycling prescribed in Example 1 is followed to produce a $GaAs_{1-x}P_x$ compound device, except as otherwise stated or inferred. Here, placing a Ga melt (with P and Zn or other P-type dopants) on a GaAs wafer and similarly heat cycling will derive the same kind of $GaAs(N)/GaAs(N^-)/GaAs_{1-x}P_x(P)$ junction (graded).

EXAMPLE 6

As a further improvement feature of the foregoing, supplemental Peltier heating is also applied to the semiconductor materials, during transit through the vertical temperature gradient, to enhance recrystallization from the substrate (helping to heat the melt and cool the wafer). Now, Peltier heating of semi-conductor material is certainly known in the art as a general proposition (see, for example, U.S. Pat. Nos. 3,086,857 to Pfann, 3,411,946 to Tramposch, and Scientia Electrica, Vol. XV, Fasc. 4 (1969), pp. 129–245). However, supplementing the vertical gradient heating of a limited-volume melt, etc. (e.g. the heating in Example 1) with Peltier heating/cooling is nowhere appreciated in the art, and according to an improved feature hereof is prescribed by the invention.

Before describing the specifics of Peltier heating as applied in the invention herein, attention is directed to FIGS. 4A and 4B and the following discussion regarding some general characteristics of Peltier heating. FIG. 4A shows an illustrated, idealized multilayer semi-conductor comprising a seed crystal layer 41, and abutting liquid layer 42, which the interface of seed 41 will be understood to gradually invade (as transition layer 41') across distance ax with an abutting graphite block 43 on the other side of layer 42 and a pair of oppositely charged electrical contacts as illustrated. Semi-conductor 40 will be understood as subjected to a prescribed temperature gradient $\Delta T$, as indicated between a high temperature $T_2$ and a lower temperature $T_1$. FIG. 4B shows the same arrangement with the heat flow in the same direction, i.e., the direction of "regrowth" and with a graphite block 45 provided in contact with the external face of seed layer 41.

Now, while this solid-liquid interface is subjected to a certain nominal temperature gradient ($\Delta T = T_L - T_s'$ where $T_L$ = temperature at the liquid, $T_s$ = temperature at the solid interface), a current flow through the interface will increase this temperature gradient to a high degree and cause more perfect regrowth. The principal application utility and novelty of this feature lies in the combination of external temperature gradient, and Peltier-enhancement of $\Delta T$ for a "limited melt" device.

The basic conditions for temperature gradient zone melting are as follows. The seed crystal 41 with thermal conductivity $k_s$ and heat capacity $c_s$ faces the liquidus L (layer 42) having thermal conductivity $k_L$ and heat capacity $c_L$. On the other side of the liquid melt 42, graphite block G allows for electrical contact (polycrystalline material is located here in conventional methods, e.g. for lateral monocrystallization). In the case of current flow through the liquid/solid interface, a current density j sets up a temperature gradient due to the different conductivities in liquid and solid:

$$j(P) = + (k_L \Delta T_L - k_s \Delta T_s)$$

where

P = Peltier coefficient
$\Delta T_L$ = temperature gradient in liquid
$\Delta T_s$ = temperature gradient in solid While this method usually is applied for moving the liquid across a polycrystalline bar, it is used according to this feature in a stationary system to enhance growth from the substrate and to increase the natural temperature gradient (in the oven). The heat absorbed due to the internal energy difference in liquid and solid is $(c_L - c_s)$ T dx where dx represents the movement of the solid interface (see FIG. 2A).

In a vertical furnace the temperature gradient is correct when the wafer-package moves downward from the maximum heat zone so that it develops the desired graded junction recrystallization from the seed-crystal (upwards as shown in FIG. 4B). The temperature gradient generally does not exceed a few ° C/cm in embodiments like those described. However, with Peltier heating, this gradient can be increased considerably, e.g. as seen from the difference in $k_L$ and $k_s$ which amounts to a factor of approximately 10. Here, the bias has to be such as to connect the positive pole to the seed crystal. (The interface moves away from the positive end.)

Figure 5A:
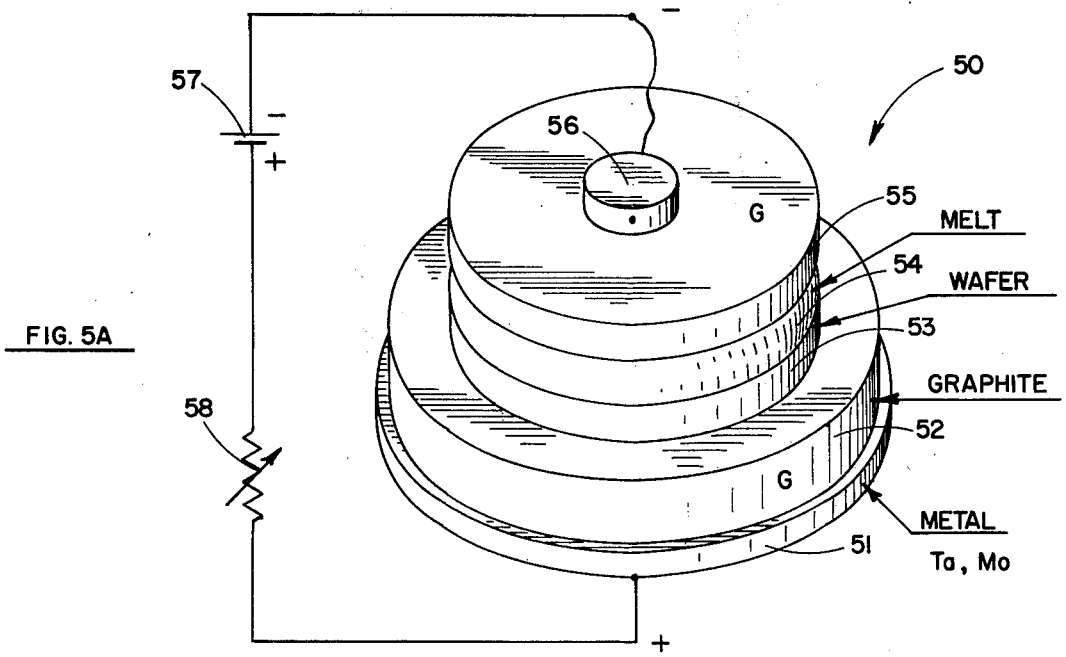
FIG. 5A shows, in schematized, frontal elevation, a typical embodiment adapted for treatment according to one invention comprising a limited melt and substrate wafer as contained between a pair of graphite supports and related charged conductor means; with FIG. 5B showing the band potentials thereof and FIG. 5C showing the variation of Peltier coefficient with voltage (gap)

FIG. 5A illustrates a melt-wafer package 50 for liquid epitaxy like that in Example 1. Here, a wafer 53 is placed on a graphite support 52 which is contacted via metal contact 51 with voltage source 57 and adjustable impedance 58. A limited-volume melt 54 is placed on the top surface of the wafer 53 and another plate of graphite 55 with a contact 56 is floated on melt 54. FIG. 5B shows the band scheme for the interface here. As a voltage V is applied (FIG. 5C) the Peltier coefficient changes from the positive to negative values as the quasi-Fermi level moves across the gap. It is therefore favorable to apply a value of ¼ × Eg [Eg is the energy value of the forbidden gap, or the Peltier bias; $E_F$ is the Fermi level; $E_c$ is the level of the conduction band, i.e., the electron energy upward depends on the internal resistance of the sandwich 50 and the voltage distribution therein] for which external voltage this is the case.

Peltier Heating

Figure 6:
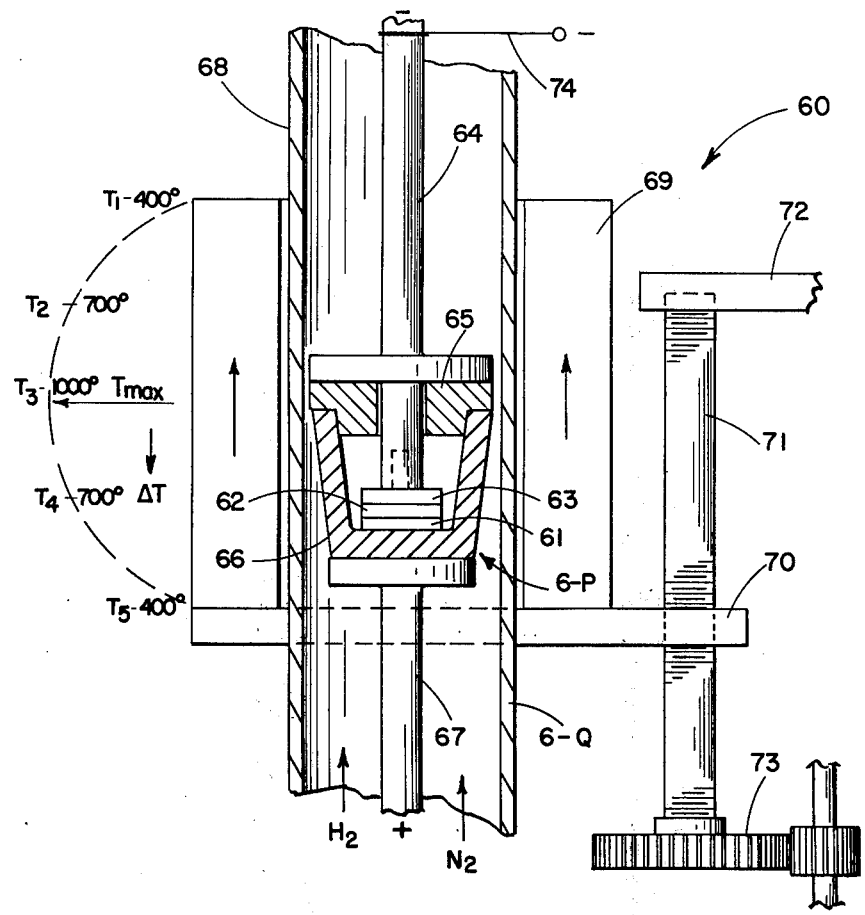
FIG. 6 is a front elevation of an alternate embodiment to that in FIG. 2 showing an arrangement for heat treating and Peltier cooling a melt-wafer package according to the invention, with transport means being very schematically shown and (oven) temperature distribution being schematically indicated along the length of the heating tube.

An Example will now be described wherein the limited-melt/wafer combination of Example 2 GaAs - $Ga_{0.7}Al_{0.3}As$ will be heat treated as in Example 1, the materials and conditions, etc. being the same except where otherwise noted; with, however, the added feature of Peltier heating according to a slightly modified heating array 60 wherein the subject package 6-P is adapted to be heat treated in an oven 62 (FIG. 6). These arrangements and conditions are much the same as for the above-described Example 1, except for the Peltier heating and where otherwise noted. Thus, the package 6-P comprises a graphite crucible 66 containing a substrate wafer (here, GaAs — although GaP, or other III/V crystals may be substituted as understood in the art); a limited-volume melt 62 resting on wafer 61; and a graphite cover 63 resting on the melt. A graphite contact rod 64 is also provided being pressed down upon cover 63 for electrical contact; an annular insulative quartz spacer 65 is also provided between a flanged portion of rod 64 and the upper edges of crucible 66. Package 6-P is disposed within a cylindrical quartz tube 68 being mounted therein upon a fixed-position graphite platform 67 adapted to support package 6-P, as well as provide an electrical conductive contact which, in conjunction with upper opposite contact 64, provides a pair of positive and negative terminals respectively for application of Peltier heating-cooling current.

However, unlike the prior Example, the package 6-P is kept stationary within tube 6-2 while the oven heating coils 69 are adapted to be translated, slowly and with great precision, vertically therepast. Thus, heating coils 69 are mounted on a prescribed transport arrangement comprising carrier platform 70 adapted to be translated by lead screw 71 and associated power gear 73 (screw 71 generally positioned in bracket 72). These are coupled to provide gradual control upward motion of heater coil 69 to transport a prescribed heating profile (analogous to profile 3-P in FIG. 3) past package 6-P. Heater 69 is adapted to have a temperature profile of the type giving the indicated temperature cycle readings at the package 6-P.

Here again, the heater (oven 69 plus transport) represents an arrangement for impressing a prescribed thermal gradient for the described melt-back/regrowth upon the wafer sandwich 6-P translated relative to the heater elements 69. If these elements were not moved upward by a mechanical drive means, alternatively, the package 6-P may, of course, be lowered from the center of the oven. The speed of the translation, of course, depends upon the oven construction and gradient — i.e., its length (here, 18 to 30 inches, translation being over the central 10 to 15 inches thereof) and its temperature gradient, indicated in FIG. 6. This, together, with the transport arrangement, is adjusted to cool the package 6-P (Phase III, FIG. 3) at a rate of down to 1/100° C per minute. This arrangement will be seen to provide perfect crystal regrowth and epitaxy using Peltier heating/cooling. That is, as the oven is translated upward in the indicated manner, the seed-melt package (61/62) is as in Example 1 subjected to the correct vertical temperature gradient.

That is, it will be understood that the Peltier heating can be made to "follow" the temperature gradient induced by exposure in the oven and simply magnifies it, amplifying the heating of melt 62 as well as the cooling of substrate 61 and thus amplifying their thermal differential. The Peltier current magnitude depends on wafer cross section and will here be understood to involve about ½ to 5 A./cm$^2$, helping to heat the melt (solid-liquid interface) and to cool the substrate wafer (liquid-solid interface). The resulting magnified temperature gradient helps to shorten overall treatment time and, more particularly (referencing profile 3-P in FIG. 3), facilitates a more practical, reliable, precisely controlled transport arrangement by mitigating the requirements for discontinuous increases or decreases in transport velocity. For instance, it is conceivable, though not necessary, that here the relative rate of transport between package and oven could be kept constant from beginning to end of the thermal profile (except for the initial phase) with the differences in cooling rate being adjusted by changing the Peltier current through the package, thus eliminating all shifts in transport velocity. Such a Peltier cooling arrangement is much more practical for deriving fine control over the temperature (of the order of 0.1° C) as opposed to adjusting transport speeds.

Of course, workers in the art will realize that certain nonsubstantial embellishments may be used with these embodiments, without basically changing the ideas, and still operate within the concepts heredescribed and claims. For instance, the junction device and/or its composition may be rendered in various manners. Similarly, the heating apparatus may be differently implemented without basically changing the concept heredescribed and claimed.

It will also be apparent to those skilled in the art that other materials and modes of heating may be used, separately or cumulatively, modifying those described above and that such modifications, changes and variations made in the present defined embodiment, could be effected without departing from the spirit or scope of the invention as expressed in the following claims.

What is claimed is:

1. A method for producing a superior heteroepitaxial semiconductor junction comprising superposing a prescribed doped limited volume unsaturated melt directly upon a host substrate and subjecting the resulting material to a four phase thermal cycle adapted to provide a moving external thermal gradient and a prescribed internal fixed thermal gradiant across the melt-substrate interface; the first phase comprising heating to a temperature such that the substrate is melted back to a prescribed degree and with prescribed diffusion, the dissolved substrate saturating the melt; the second phase comprising cooling at a rate adapted to rapidly arrest melting back of the substrate and terminate upward thermal momentum with attendant supersaturation; the third phase comprising cooling at a rate of 0.1°–1.0° C per minute to initiate slow recrystallization and diffusion; the fourth phase comprising cooling at a rate of 2°–5° C per minute to recrystallize the entire melt-substrate combination; wherein said limited volume is that volume which will be saturated by the substrate during melting back; whereby a graded epitaxial junction of a crystal layer having a prescribed volume and stoichiometry with very low dislocation incidence is obtained.

2. The method as recited in claim 1 wherein the melt and substrate are brought operatively adjacent a prescribed thermal gradient and moved relative thereto at a prescribed rate adapted to effect the said melt-back and recrystallization and imparting distribution.

3. The method as recited in claim 1 wherein the said heat cycling fixed internal gradient is effected at least in part by a "Peltier effect" cooling.

4. The method claim 1 wherein said substrate is a wafer, wherein a prescribed vertical temperature gradient is impressed on the melt-substrate, and wherein said melt-substrate is vertically moved through said temperature gradient to effect said four phase thermal cycle.

5. A method according to claim 1 wherein said melt comprises gallium, aluminum and zinc, and wherein the melt-substrate is subjected to a moving temperature gradient together with supplemental Peltier cooling being provided such that current is supplied to the melt-substrate interface in a direction to cool the interface after melt-back.

6. The method of claim 1 wherein the melt is selected from the group consisting of Group III/V compounds and ternary compounds thereof, Group II/VI compounds, and mixtures thereof.

7. The method of claim 6 wherein the melt comprises gallium, aluminum and zinc, and the substrate comprises gallium arsenide and silicon dopant, and wherein the concentration of aluminum varies continuously across the junction in graded fashion with the silicon concentration varying inversely and the zinc concentration in parallel to the aluminum concentration.

8. The method of claim 6 wherein said Group III/V compound is selected from the group consisting of (GaAl)As, (GaIn)As, (GaIn)P, and Ga(AsP).

* * * * *